(12) United States Patent
Pesic

(10) Patent No.: US 12,094,787 B2
(45) Date of Patent: Sep. 17, 2024

(54) CHARACTERIZING DEFECTS IN SEMICONDUCTOR LAYERS

(71) Applicant: Applied Materials, Inc., Santa Clara, CA (US)

(72) Inventor: Milan Pesic, Paoli, PA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 17/393,037

(22) Filed: Aug. 3, 2021

(65) Prior Publication Data

US 2023/0041405 A1 Feb. 9, 2023

(51) Int. Cl.
*H01L 21/66* (2006.01)
*H01L 29/24* (2006.01)

(52) U.S. Cl.
CPC ............ *H01L 22/12* (2013.01); *H01L 29/24* (2013.01)

(58) Field of Classification Search
None
See application file for complete search history.

(56) References Cited

U.S. PATENT DOCUMENTS

| | | |
|---|---|---|
| 6,512,242 B1 | 1/2003 | Fan et al. |
| 2007/0131267 A1 | 6/2007 | Kriisa |
| 2011/0233731 A1 | 9/2011 | Yamazaki |
| 2015/0255716 A1 | 9/2015 | Phatak et al. |
| 2015/0318418 A1 | 11/2015 | Kinch et al. |
| 2016/0306005 A1 | 10/2016 | Ohashi et al. |
| 2018/0308973 A1 | 10/2018 | Ebiike et al. |
| 2023/0041405 A1* | 2/2023 | Pesic ............ H01L 22/12 |

FOREIGN PATENT DOCUMENTS

| | | |
|---|---|---|
| CN | 111900097 A | 11/2020 |
| TW | 201613006 A | 4/2016 |
| WO | 2009134678 A2 | 11/2009 |

OTHER PUBLICATIONS

International Preliminary Report on Patentability mailed on Feb. 15, 2024 in International Patent Application No. PCT/US2022/074104, 6 pages.
International Search Report and Written Opinion mailed on Nov. 14, 2022 in International Patent Application No. PCT/US2022/074104, 10 pages.

* cited by examiner

*Primary Examiner* — Jack S Chen
(74) *Attorney, Agent, or Firm* — Kilpatrick Townsend & Stockton LLP

(57) ABSTRACT

A method of characterizing defects in semiconductor layers may include forming a first electrode, a first barrier layer, a semiconductor layer, and a second electrode, where the first barrier layer is between the first electrode and the semiconductor layer, and the semiconductor layer is between the first barrier layer and the second electrode. The method may also include causing current to flow through the semiconductor layer, where the first barrier layer prevents the current from entering a conduction band of the semiconductor layer and instead causes current to flow through defects in the semiconductor layer. The method may also include characterizing the defects in the semiconductor layer based on the current flowing through the defects in the semiconductor layer.

12 Claims, 10 Drawing Sheets

CHARACTERIZING DEFECTS IN SEMICONDUCTOR LAYERS

TECHNICAL FIELD

This disclosure describes characterizing defects in oxide-semiconductors, semiconductor layers, and small bandgap devices. Specifically, barrier layers may prevent current from flowing in the conduction band, instead redirecting the current through the defects—or forcing defect assisted hopping and transport—to be evaluated through defect spectroscopy.

BACKGROUND

Semiconductor oxides of various compositions may be used as semiconductor layers in silicon-based devices. For example, indium gallium zinc oxide (IGZO) is a semiconducting oxide material that includes varying amounts of indium, gallium, zinc, and oxygen. IGZO transistors may be used in flat-panel displays due to their high electron mobility that provides improved speed, resolution, and display size. IGZO can also be deposited as a uniform amorphous phase while retaining the high carrier mobility common in semiconductor oxides. However, like most semiconductor oxides, IGZO compositions are not well understood from a physics standpoint. Specifically, defects formed in the semiconductor oxides are difficult to characterize for each available composition without expensive and complicated test equipment, such as deep-level transient spectroscopy (DLTS).

BRIEF SUMMARY

In some embodiments, a method of characterizing defects in semiconductor layers may include forming a first electrode, forming a first barrier layer, forming a semiconductor layer, and forming a second electrode. The first barrier layer may be between the first electrode and the semiconductor layer. The semiconductor layer may be between the first barrier layer and the second electrode. The method may also include causing current to flow through the semiconductor layer. The first barrier layer may prevent the current from entering a conduction band of the semiconductor layer and instead may cause current to flow through defects in the semiconductor layer. The method may further include characterizing the defects in the semiconductor layer based on the current flowing through the defects in the semiconductor layer.

In some embodiments, a system for characterizing defects in semiconductor layers may include a defect spectroscopy system configured to cause current to flow through a semiconductor and barrier stack. The semiconductor and barrier stack may include a first electrode, a first barrier layer, a semiconductor layer, and a second electrode. The first barrier layer may be between the first electrode and the semiconductor layer. The semiconductor layer may be between the first barrier layer and the second electrode. The first barrier layer may prevent the current from entering a conduction band of the semiconductor layer and instead may cause current to flow through defects in the semiconductor layer. The defect spectroscopy system may also be configured to characterize the defects in the semiconductor layer based on the current flowing through the defects in the semiconductor layer.

In some embodiments, a semiconductor and barrier stack may include a first electrode, a first barrier layer, a semiconductor layer, and a second electrode. The first barrier layer may be between the first electrode and the semiconductor layer. The semiconductor layer may be between the first barrier layer and the second electrode.

In any embodiments, any or all of the following features may be implemented in any combination and without limitation. The method may also include forming a second barrier layer between the semiconductor layer and the second electrode. The first barrier layer may prevents a metal-semiconductor interface from forming between the first electrode and the semiconductor layer. The method may also include forming a barrier stack comprising a top electrode, a barrier layer, and a bottom electrode, where the barrier layer comprises a same material as the first barrier layer; characterizing the defects in the barrier layer; and providing locations and types of the defects in the barrier layer as an input to a process for characterizing the defects in the semiconductor layer. The method may also include forming a semiconductor stack comprising a second top electrode, a second semiconductor layer, and a second bottom electrode, where the second semiconductor layer comprises a same material as the semiconductor layer; characterizing the second semiconductor layer to identify a doping level or a metal-semiconductor junction characteristic; and providing the doping level or the metal-semiconductor junction characteristic input to the process for characterizing the defects in the semiconductor layer. Characterizing the defects in the semiconductor layer may include identifying a distribution of defects in the semiconductor layer; identifying a mean of the distribution of the defects in the semiconductor layer; and identifying a location of the mean of the distribution relative to a conduction band of the semiconductor layer. Characterizing the defects in the semiconductor layer may also include using the location of the mean to identify a type of the defects in the semiconductor layer by comparison to a predetermined distribution of defects types in a material used in the semiconductor layer. The method may also include simulating a model of a circuit, where the model may include a layer of a material used in the semiconductor layer; and types and locations of defects in the material. The first electrode may have a work function that is higher than a work function of the second electrode, and a work function difference between the first electrode and the second electrode may induce an electric field across the semiconductor and barrier stack. The semiconductor layer comprises a composition of indium, gallium, and zinc oxides. The first barrier layer may have a bandgap energy that is at least 1.5 times greater than a bandgap energy of the semiconductor layer.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1B:
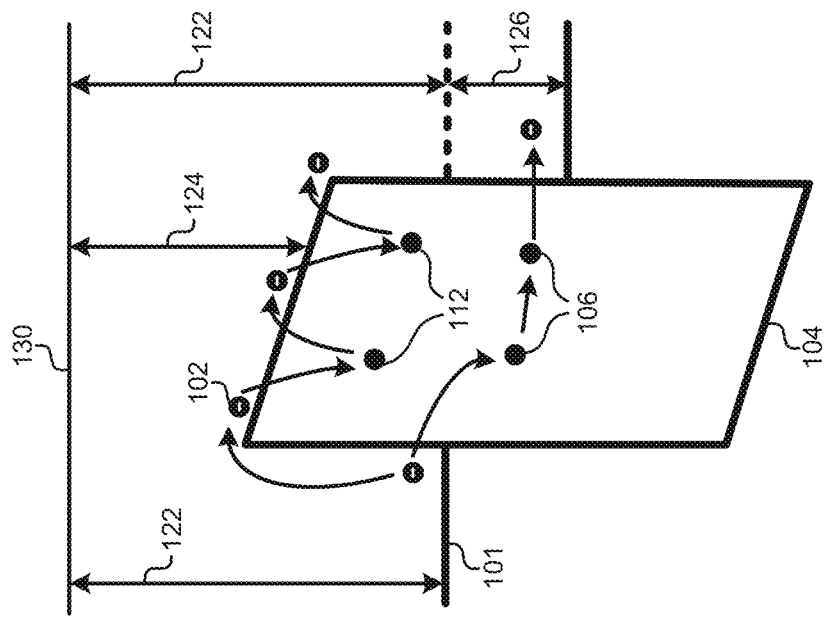
FIG. 1B illustrates an energy band diagram that shows how carriers can engage in trap-assisted (or so-called defect assisted) tunneling or hopping, according to some embodiments.

In semiconductor devices, oxide-semiconductors, or small-bandgap, high-electron affinity materials, such as transistors and any other devices utilizing a semiconductor channel, the performance of the device depends on properties such as channel mobility or the ability to conduct current through the channel in its ON and OFF state. The performance of this semiconductor channel depends primarily on its crystallographic orientation, but also on the defects that may be present, especially in the channel. For example, 3D NAND Flash devices may include a source and a drain with a polycrystalline channel between the source of the drain. The polycrystalline channel may include defects in the structure that affect the charge carrier mobility between the source and the drain. Driving charge carriers through the polycrystalline structure may cause a scattering effect that reduces the drain current of the device and makes the drain current more variable between devices. In addition the reduction of the ON current, which increases the resistance of the channel, defects also limit the number of the gates (e.g., wordlines) that can be stacked on top of each other along the long polycrystalline channels used in 3D NAND strings. While limiting the number defects is a desirable goal during manufacturing, it is also important to be able to detect existing defects, monitor the impact of different process steps on the number and nature of the defects, and to thereby limit their effect on the operation of the device after manufacturing.

Understanding and identifying these defects in a device are important for predicting the performance of the device during operation. For example, identifying oxygen vacancies and/or metallic vacancies and their positive/negative variations as a defects of a specific type (such as double/single positively or negatively charged vacancies) can be used to predict the variability, reliability, and tolerance of the device over time. However, the defects in the semiconductors cannot be easily measured directly using techniques that are used to directly measure oxide defects. In order to measure defects and semiconductor layers, current techniques include using defect-level transient spectroscopy (DLTS). The equipment set up for this procedure are complicated and expensive, as the process requires high precision instruments and precise temperature and other environmental controls. Therefore, DLTS is not an ideal method for detecting semiconductor defects on a large scale, as the complexity of the procedure limits the throughput in material screening. Complicating matters further is the fact that direct measurements of defects are often inaccurate. Specifically, the small bandgap of the semiconductor material and the formation of the metal-semiconductor junction causes current to be diverted away from the defect region in the bandgap to instead flow through the metal-semiconductor junction to the conduction band. This effectively hides the defects within the semiconductor band as current flows through alternative routes.

Figure 1A:
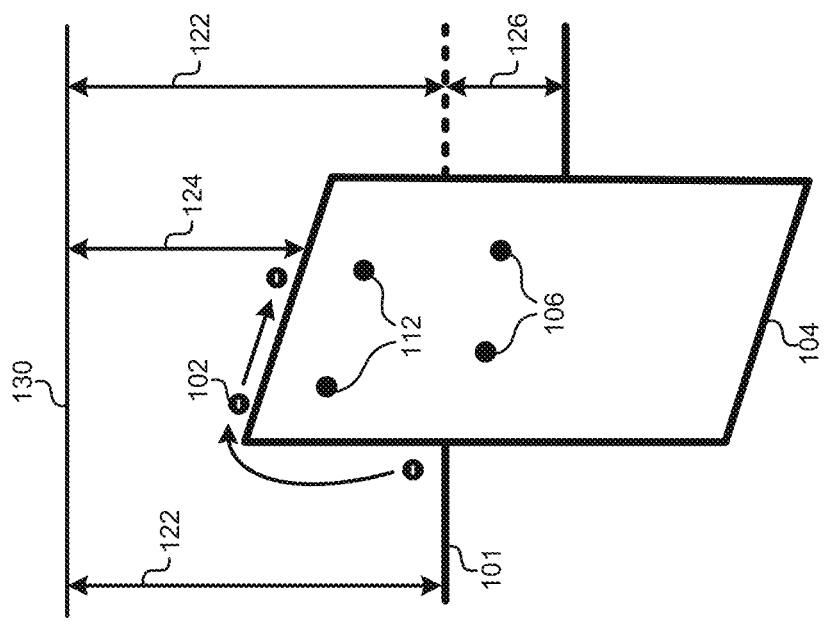
FIG. 1A illustrates an energy band diagram that shows how charge carriers can propagate through a semiconductor while avoiding direct conduction through the semiconductor's defects, according to some embodiments.

FIG. 1A illustrates an energy band diagram that shows how carriers can propagate from electrode to electrode through a semiconductor while avoiding direct conduction through the semiconductor, according to some embodiments. A semiconductor device may include a metal 101, such as an electrode, and a semiconductor layer 104. The metal 101 and the semiconductor layer 104 may form a metal-semiconductor junction. A carrier 102 ideally will flow from the metal 101 through the semiconductor layer 104 and be affected by the defects 106, 112 in the semiconductor 104. However, as illustrated in FIG. 1A, the carrier 102 may instead flow through the conduction band of the semiconductor rather than through the defect-assisted pathways within the semiconductor layer 104. Note that the semiconductor layer 104 may include a semiconductor material, a semiconducting oxide material, and/or other small-bandgap, high-affinity materials. However, for simplicity this disclosure will refer to this layer as the "semiconductor layer" 104 with the understanding that any of these other materials may be used for this layer in any combination and without limitation.

FIG. 1A shows the bandgap energies relative to a vacuum level 130. For example, a work function 122 of the first electrode 101 is illustrated relative to the vacuum level 130. Similarly, the electron affinity 124 of the semiconductor layer 104 is also illustrated relative to the vacuum level 130. Note that the voltage applied to one of the electrodes is superimposed on the work function of that electrode. For example, the potential shift (qV) 126 represents the elementary charge (q) multiplied by the voltage applied, V to the second electrode. The total distance from the vacuum level 130 for the second electrode is the work function 122 of the metal added to the qV 126 value. Note that V can be positive or negative, so the energetic distance can be reduced or increased for the value of qV.

FIG. 1B illustrates an energy band diagram that shows how carriers can engage in trap-assisted (or so-called defect-assisted) tunneling or hopping, according to some embodiments. In this example, the carrier 102 may tunnel through the semiconductor oxide or semiconductor layer 104 by "hopping" between the defects 106. Alternatively, the carrier 102 may hop back and forth between the defects 112 and the conduction band. In both of these scenarios, the conduction paths may be heavily influenced by the metal-semiconductor junction formation as well as by the relative height of the energy band of the semiconductor layer 104 compared to the metal 101.

Note that these problems are exacerbated for semiconductor oxides, which are not well understood in the art. In order to implement future 3D DRAM stacks that use semiconductor oxides, or to enable rapid material screening semiconductor devices, a technique is needed that accurately can characterize defects in transistor and memory structures. Additionally, some semiconductor oxide materials may be comprised of compositions of gallium oxide, zinc oxide, and indium oxides and other similar materials. While the stoichiometry of these compositions may primarily determine the intrinsic (theoretical) mobility of the materials, the defects within these compositions may also affect the carrier mobility (referred to as extrinsic or "measured" mobility). This requires multiple dimensions of analysis that may be too complicated to be practical.

The embodiments described herein solve these and other technical problems by inserting an additional layer between the metal 101 and the semiconductor layer 104 to disrupt the metal-semiconductor junction and prevent carriers from entering the conduction band. Additionally, some embodiments may also use precise metal work function tuning to adjust the injection level of the device. This additional barrier material may be a dielectric that has a higher bandgap than the semiconductor layer 104. This forces the carriers through the energy bandgap of the semiconductor layer 104. By forcing the carriers to take this route through the energy bandgap of the semiconductor layer 104, the effect of the defects on the current flow can be more readily detected and measured through conventional leakage current measurements, such as DC current-voltage measurements among others described below or know in the art. This accommodates the redirection of the current flows through the defect region such that it can be measured and characterized. By surrounding the semiconductor material with one or two dielectric materials and using precise engineering of the electrode work functions used by the test scenario, the embodiments described herein prevent the metal-semiconductor junction formation and drive the current through the defects within the structure in such a way that these techniques can determine the nature of the defects using a simple leakage current measurements.

The embodiments described herein may utilize a defect spectroscopy technique, which leverages the concept that different electrical characterization techniques excite only a fraction of the defects in the semiconductor layer. In one example, current measurements (e.g., I(V) and I(time)) may excite a first subset of the defects in the semiconductor layer. In another example, increasing the temperature of the measurement may excite defects deeper within the bandgap such that they can be fingerprinted. Defects may be characterized with both their thermal and relaxation activation energies, where "thermal energy" denotes an energy level required for a trapped electron to be ionized from the defect level to the conduction band, and "relaxation energy" denotes how much the defects relax (energetically) during the trapping event. Other techniques, such as capacitance (C-V) measurements, conductance measurements (G-V), both as a function of frequency, may excite second, third, etc., subsets of defects closer to the interface or deeper in the central bandgap of the semiconductor layer. By performing multiple electrical characterization techniques together, a more complete map of the defects in the semiconductor layer may be obtained.

Figure 2B:
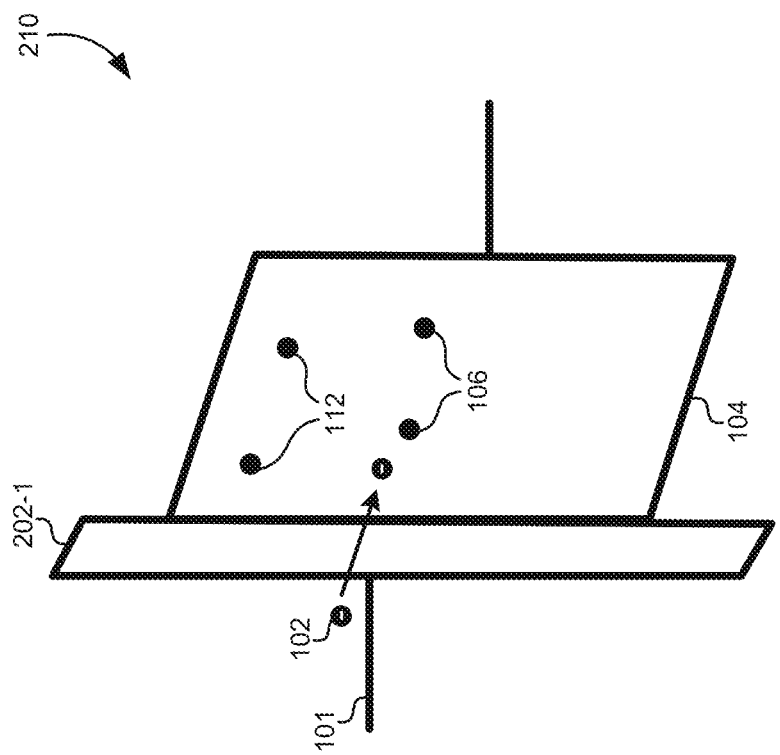
FIG. 2B illustrates an energy band diagram where a single barrier layer is placed on one side of the semiconductor layer, according to some embodiments.
Figure 2A:
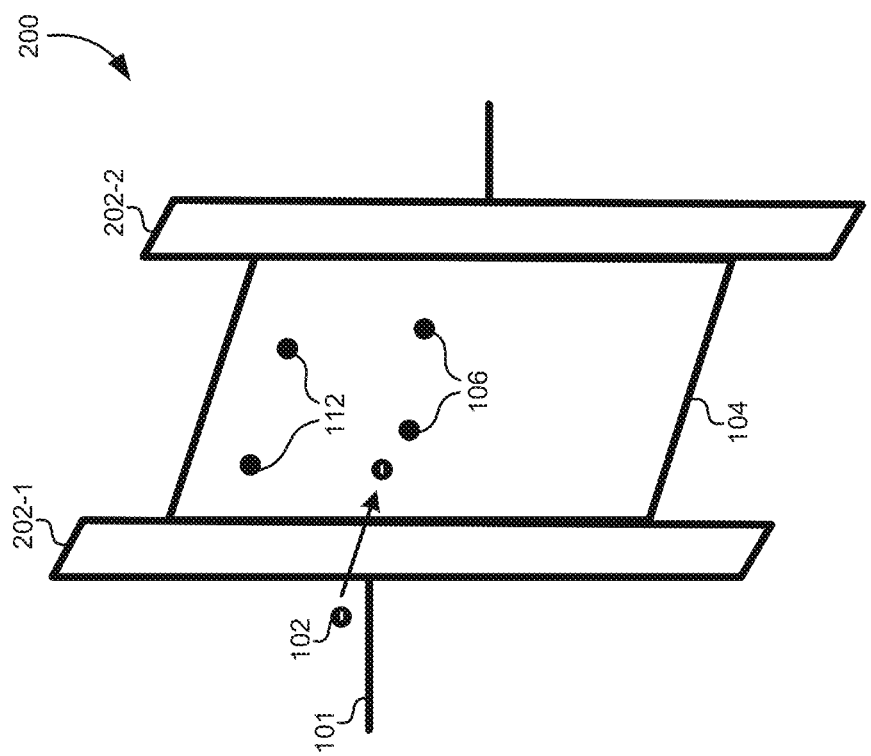
FIG. 2A illustrates an energy band diagram where barrier layers are placed on either side of the semiconductor layer, according to some embodiments.

FIG. 2A illustrates an energy band diagram 200 where barrier layers 202 are placed on either side of the semiconductor layer 104, according to some embodiments. The barrier layers 202 may use any material having a higher bandgap than the semiconductor layer as depicted in FIG. 2. In some embodiments, the bandgap of the barrier layers 202 may be at least approximately 1.5 times greater than the bandgap of the semiconductor layer 104. For example, oxides having relatively low dielectric constants, such as aluminum oxide, silicon oxide, and/or other similar materials may be used for the barrier layers 202. The magnitude of the bandgap of the barrier layers 202 prevents the carrier 102 from jumping into the conduction band and missing conduction paths that would encounter the defects 106, 112. The barrier layers 202 also disrupt the formation of a metal-semiconductor junction between the metal 101 and the semiconductor layer 104. FIG. 2B illustrates an energy band diagram 210 where a single barrier layers 202-1 is placed on one side of the semiconductor layer 104, according to some embodiments. The second barrier layer 202-2 is optional, and may be used to make the device bidirectional.

Figure 3:
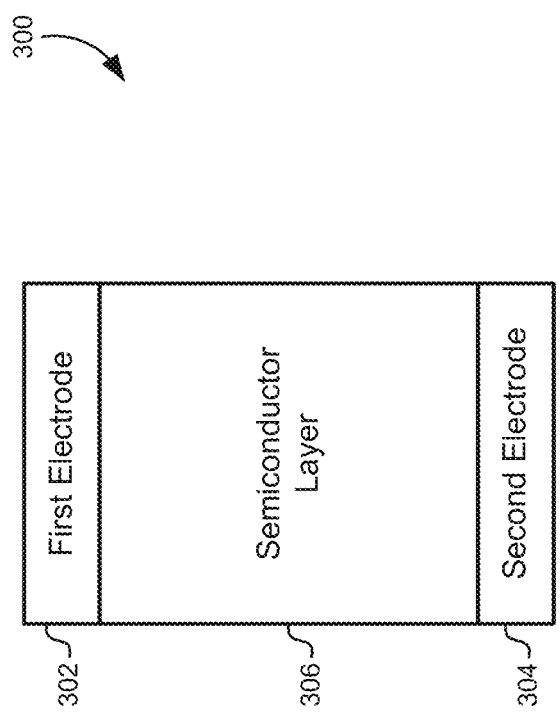
FIG. 3 illustrates a first stack 300 that may be used to characterize the defects in the semiconductor layer, according to some embodiments.

FIG. 3 illustrates a first stack 300 that may be used to characterize the defects in the semiconductor layer, according to some embodiments. In order to accurately determine the effect of the defects apart from the effect of the barrier layers, multiple stacks may be characterized as described below. The first stack 300 may also be referred to as a "semiconductor stack," as its purpose is to characterize the baseline characteristics of the semiconductor material being investigated. The first stack 300 may include a first electrode 302 and a second electrode 304 comprising a metal, such as platinum. The first electrode 302 and the second electrode 304 may also be fabricated using doped semiconductors or other electrode materials, depending on the particular device being characterized. The first electrode 302 and/or the second electrode 304 may also be referred to as top/bottom electrodes interchangeably. The first stack 300 may also include a semiconductor layer 306. For example, the semiconductor layer may be fabricated using IGZO or other similar materials. IGZO is a semiconducting material, comprised of indium, gallium, zinc, and oxygen. IGZO may include many different ratios of these different elements to form semiconductor oxides having different properties. In one example, the semiconductor layer 306 may be approximately 15 nm thick, and may generate metal-semiconductor interfaces between the first electrode 302 and the semiconductor layer 306 and between the second electrode 304 and the semiconductor layer 306.

Again, the precise materials used for the semiconductor layer 306 and the first electrode 302 and the second electrode 304 may vary widely, as this methodology is focused on measuring the characteristics and defects of the semiconductor device rather than being limited to any particular composition of materials in a semiconductor device. This first stack 300 may serve as a control stack to characterize the device in the absence of the barrier layers. When measuring the first stack 300, various electrical stimuli (voltage, currents, etc.) may be applied in order to measure the effect of the interface of the semiconductor layer 306 with the metal of the first electrode 302 and/or the second electrode 304. The characterization of the first stack 300 may also measure the doping level of the semiconductor layer 306 if present.

Figure 4:
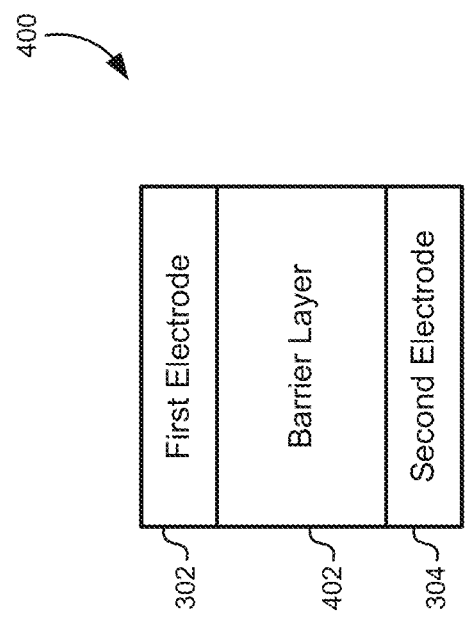
FIG. 4 illustrates a second stack that may be used to characterize the barrier layers, according to some embodiments.

FIG. 4 illustrates a second stack 400 that may be used to characterize the barrier layers, according to some embodiments. The second stack 400 may also be referred to as a "barrier stack," as it is used to characterize the material used in the one or more barrier layers. In order to isolate the effect of the defects in the final measurement, the effects of the barrier layer may first be characterized and then used as an input to the characterized of the combined stack described below. To characterize the effects of the barrier layer, a second stack 400 may be characterized comprising a first electrode 302 and a second electrode 304. The first electrode 302 and the second electrode 304 may be the same as the electrodes used in the first stack 300 such that the electrode material is not a changing variable between characterizations. The second stack 400 may serve as a control stack for the barrier layer 402 in particular.

The particular material used as the barrier layer may include a wide range of materials, such as aluminum oxides, that meet the bandgap energy specifications described above. By characterizing the second stack 400, measurements can be obtained regarding the dielectric constant of the barrier layer 402, a work function difference between the first electrode 302 and the second electrode 304, and/or any defect properties of the barrier layer 402. The second stack 400 may be used to effectively characterize the parameters of the barrier layer 402 before it is added to the semiconductor layer 306 as well as any potential process-induced asymmetries.

Figure 5:
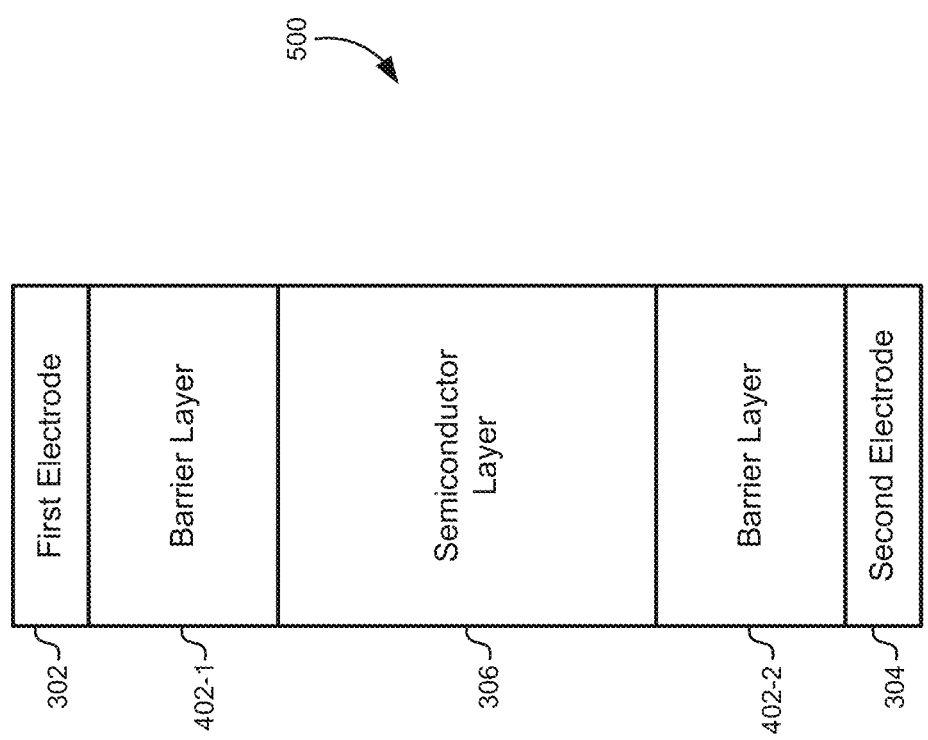
FIG. 5 illustrates a third stack that can be used to characterize the defects of the semiconductor layer, according to some embodiments.

FIG. 5 illustrates a third stack 500 that was energetically represented with the band diagram in FIG. 2A that can be used to characterize the defects of the semiconductor layer 306, according to some embodiments. The third stack 500 may also be referred to as a "semiconductor and barrier stack," as it may include both of these materials. The third stack 500 may include barrier layers 402, electrodes 302, 304 and a semiconductor layer 306 using the same material with the same properties that were used in the first stack 300 and the second stack 400 described above. Although many different materials may be used, one example stack may use aluminum oxide having a thickness of approximately 3 nm for the barrier layers 402 to prevent direct tunneling, and IGZO having a thickness of approximately 8 nm for the semiconductor layer 306. Performing measurements on the third stack 500 can characterize specifically the defects of the semiconductor layer 306.

The parameters that were measured for the first stack 300 and the second stack 400 may be used by the characterization process of the third stack 500. For example, the doping level of the semiconductor layer 306, the dielectric constant of the barrier layers 402, the electrode work function difference, the defect properties of the barrier layers 402, and/or any other parameters may be used by the process for characterizing the third stack 500. This allows the process to characterize in isolation the defects of the semiconductor layer 306 and to perform a benchmarking of the entire device.

In some embodiments, a process for characterizing the defect levels of various compositions of semiconductor materials, such as IGZO, may operate by fabricating a single second stack 400 to characterize the characteristics of the barrier layers 402. Then, the process may vary the stoichiometry of the IGZO to use compositions with varying levels of indium, gallium, and/or zinc oxides for use in the first stack 300 and/or the third stack 500. The third stack for each different stoichiometry of the semiconductor layer 306 may then be characterized to map various stoichiometries to corresponding defect levels. The fixed properties of the barrier layers 402 can be characterize a single time in order to characterize the defect level of semiconductor layer.

Figure 6:
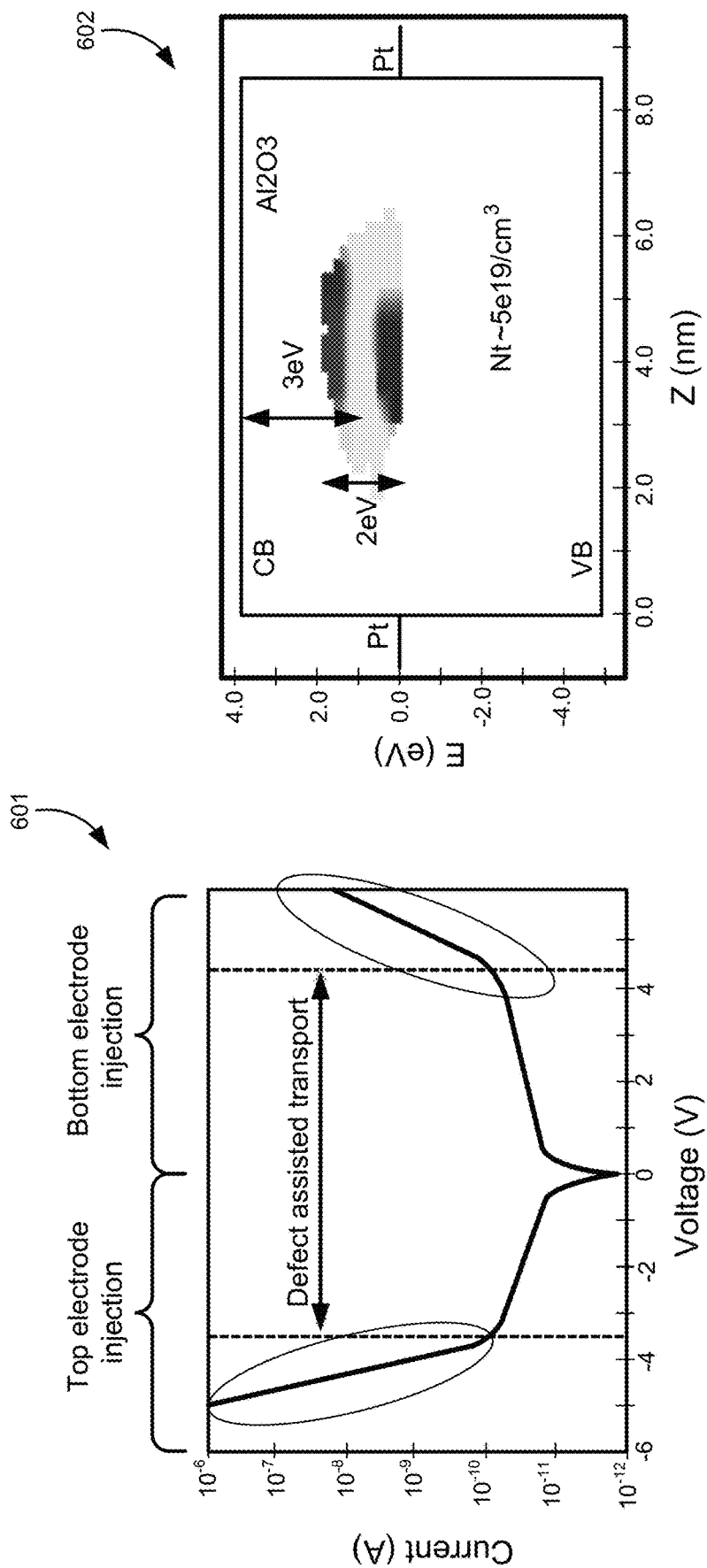
FIG. 6 illustrates example current-voltage measurements that may be made for the barrier layer and its energetic band gap together with the internal defect band, according to some embodiments.

FIG. 6 illustrates example result of the current-voltage (I-V) measurements that may be made on the barrier layer, according some embodiments. These measurements may result from the second stack 400 described above used to characterize the barrier layer in isolation of the semiconductor layer. A graph 601 illustrates the result a test where voltage is gradually ramped up over time and applied to any of the electrodes of the device. For example, the voltage may be ramped linearly over time, or may use a stair-step voltage waveform to gradually increase. In some embodiments, an AC signal may be superimposed on the voltage waveform in order to perform capacitance-voltage spectroscopy and/or conductance-voltage spectroscopy as described above. This AC signal may create small perturbations that cause the excitations of any defects that are close to the material interfaces. Increasing the AC frequency may cause defects closer to the interface of the material to be excited and thus be fingerprinted by the response.

Note that the characterizing I-V curves of the second stack for the barrier layer need not be symmetric. The interface between the second electrode 304 and the barrier layer 402 may undergo more processing steps than the interface between the barrier layer 402 and the first electrode 302. The interface with the second electrode is subject to all of the process variations that take place on top of the second electrode from subsequent layers in the stack. This may result in a work function that is noticeably different between the two electrodes. In this example, a work function differential of approximately 0.4 eV may exist between the electrodes due to differences in the manufacturing process.

The I/V curve illustrated in graph 601 is only one of a number of different characterizations that may take place as part of the overall defect spectroscopy process. Recall that defect spectroscopy applies a number of different stimuli to the device and measures a number of different characteristics. For instance, as voltage is applied to the device, measurements may be made of the current, the dielectric constant (k-value), the capacitance, and/or other electrical or physical characteristics of the device.

Based on the UV curve in graph 601, the defect density and energy levels of these defects can be extracted and mapped. For example, the extraction of the defect map may use a modeling platform tool (such as Ginestra® from Applied Materials®, among others). The results of the measurements conducted on the devices may be fed into this type of tool, and the defect properties may be extracted as an output. Defect spectroscopy calculates the tunneling paths and probability of the charge carrier and determines the optimal defect configuration that satisfies all measurement conditions and all measurement results simultaneously, combining the different measurement conditions and results that were obtained through different measurement techniques. This generates a unique map where each defect has its own identifier (e.g., nature, relaxation energy, thermal ionization energy, spatial (X,Y,Z) position, etc.). Graph 602 illustrates an energy band diagram showing the location in the Z-dimension of the defects, as well as their energy level within the bandgap in the energy band diagram. The defect density is approximately 5e19 defects/$cm^3$, and these defects occupy a distribution within the barrier layer. The distribution these defects occupy includes an approximately 2 eV spread in the center portion of the barrier layer, and the median of the defect distribution is approximately 3 eV below the conduction band of the barrier layer. In this particular example, the pattern of the distribution indicates that the distribution may be bimodal having two peaks on both edges of the distribution.

Figure 7:
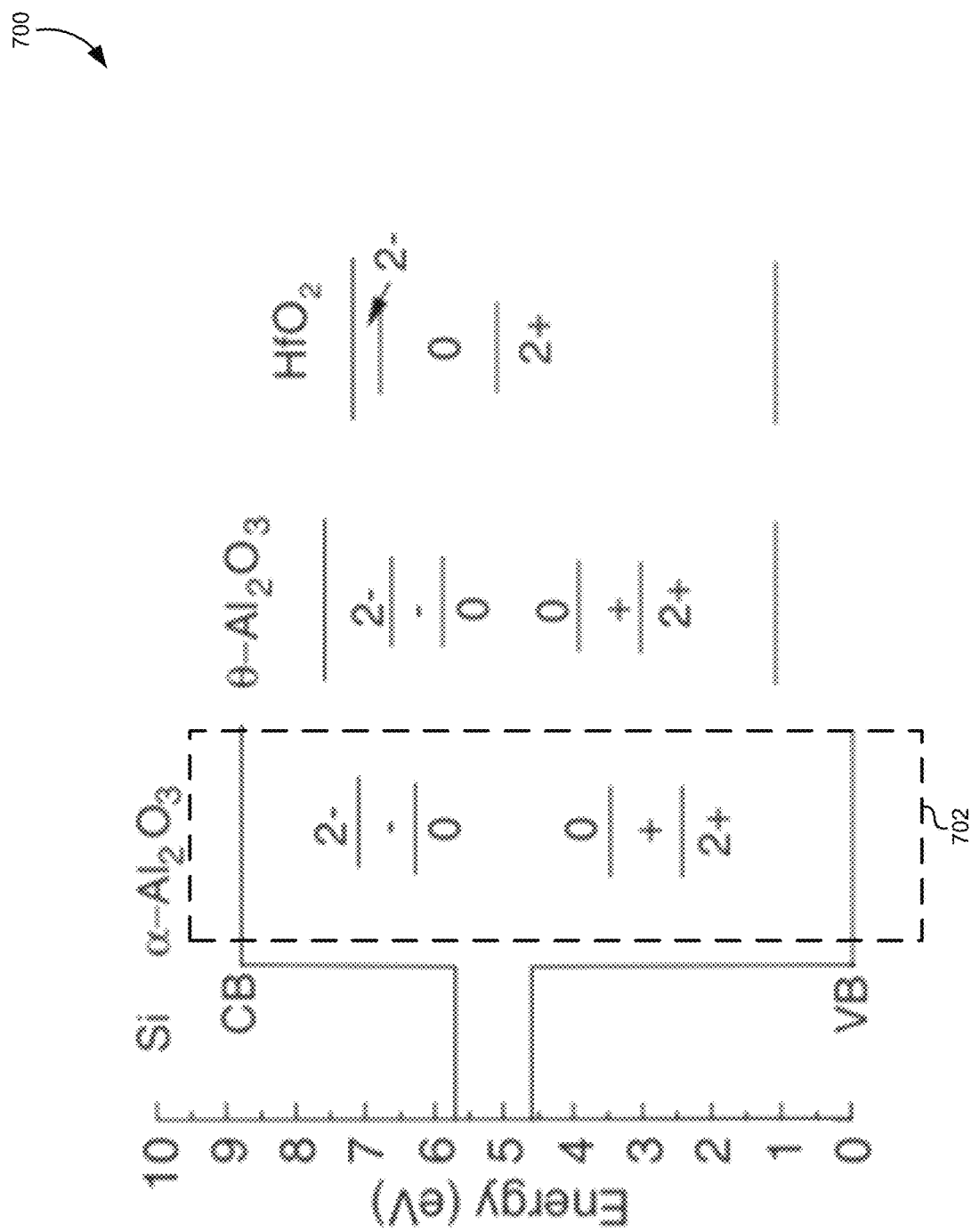
FIG. 7 illustrates a chart of defect locations and types of different materials and different phases of the material that may be used as barrier layers, according to some embodiments.

FIG. 7 illustrates a chart 700 of defect locations within the bandgap and types of different materials that may be used as barrier layers, according to some embodiments. Note that the chart 700 may be a partial chart, and many other barrier materials may be considered. The defect distributions in different materials are known and published as references in the art. The defect distribution identified from graph 602 may be superimposed on the chart 700 to identify the types of defects in the barrier material by comparison to these predetermined distribution of defect types in the particular material used for the semiconductor layer. Specifically, the defect distribution/location in graph 602 may be used to identify the type of defects using chart 700 and other charts characterizing materials in the available literature. This predetermined distribution of defect types may be readily available in various references that are well known in the art. However, this disclosure proposes using the defect distribution identified in graph 602 to map the locations of these defects to specific defect types listed in chart 700. For example, the second column 702 of the chart 700 illustrates an amorphous phase of aluminum oxide that may be used as a barrier layer. The (2−) indicates an oxygen vacancy that is filled with two electrons, the (0) indicates a neutral oxygen vacancy that is empty, and the (2+) indicates an oxygen vacancy that can accept two electrons. These types and energy levels of the defects may be then used to characterize the defect distribution measured in graph 602. In combination, graph 602 and chart 700 provide a complete picture of the types, locations, energy levels, and distributions of defects in the barrier layer being characterized. For example, chart 700 identifies the defects as neutral oxygen vacancies (0) at a level of 6 eV, which is approximately 3 eV below the conduction band of amorphous silicon used in the barrier layer.

At this stage in the process, the first stack comprising the semiconductor layer alone may have already characterized the interface between the electrode and the semiconductor layer, as well as any doping that may be present in the semiconductor layer. Next, as described above in FIGS. 7-8, the barrier layer may be characterized to identify the dielectric constant, the capacitance, and/or the work function differential between the two electrodes. The process may also identify the location, distribution, and type of defects located in the barrier layer. With this information, the characterization process may now move to the third stack 500 comprised of the semiconductor layer between the two barrier layers. This process may be used to characterize, locate, and identify the defects in the semiconductor layer, which may be the ultimate objective of this characterization process.

Figure 8:
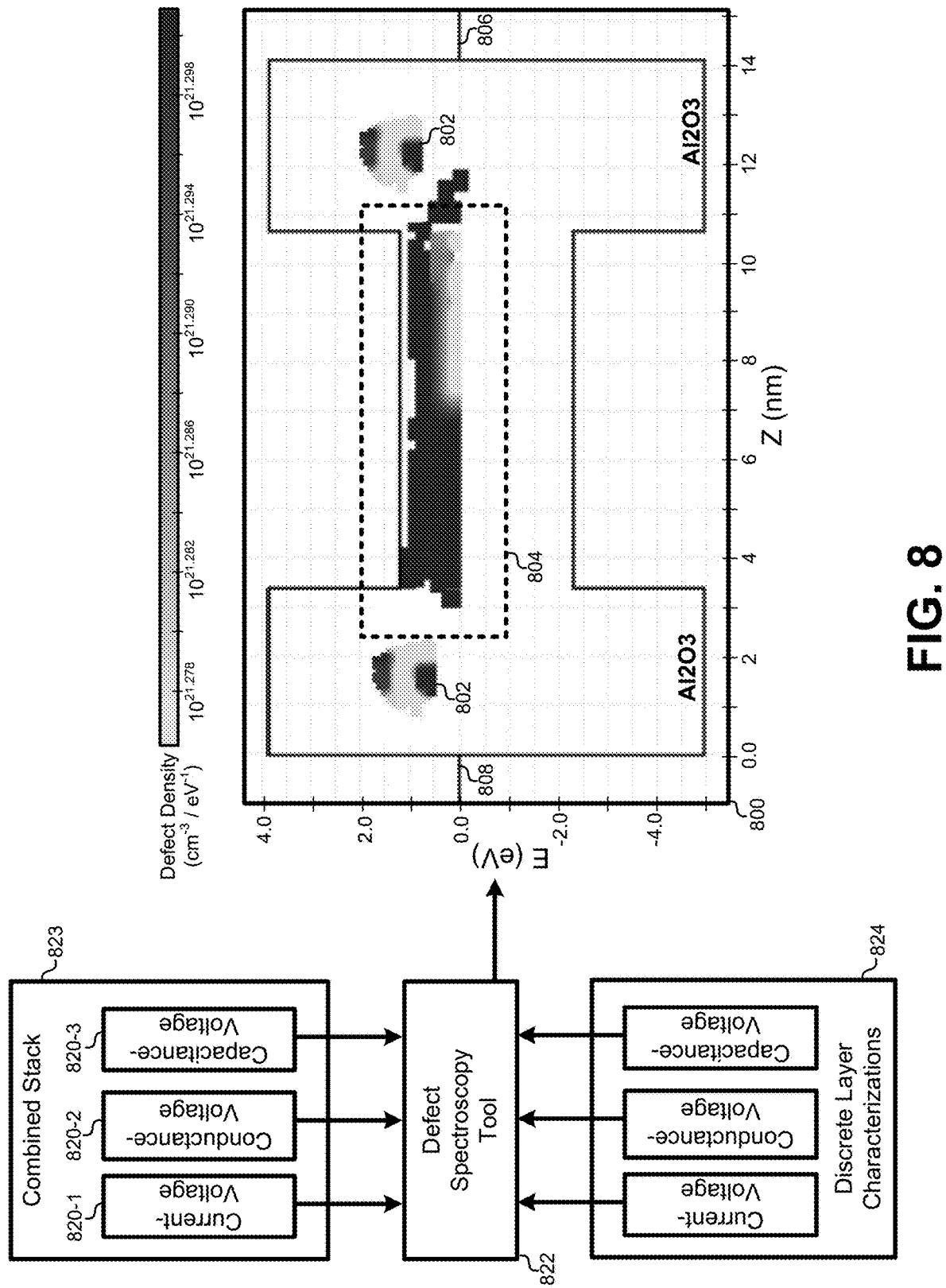
FIG. 8 illustrates the band diagram of the combined stack and results of defect spectroscopy carried out on the stack comprising the semiconductor layer between two barrier layers, according to some embodiments.

FIG. 8 illustrates the results of defect spectroscopy results carried out on the stack comprising the semiconductor layer between two barrier layers, according to some embodiments. All of the information, parameters, and physical characteristics of the semiconductor layer and the barrier layers from the previous two characterization processes may be used in a defect spectroscopy process on the combined stack. For example, voltage may be applied across the combined stack and various characteristics may be measured, such as the current, capacitance, conductance, dielectric constants, and/or other physical or electrical characteristics.

Of note is the fact that the current flows through bandgap and excites the defects within it rather than through the conduction band above the bandgap of the semiconductor layer. As described above, the barrier layers provide enough of an energy barrier to prevent electrons from ionizing directly into the conduction band and missing the defects entirely. Additionally, some embodiments may also use high-work-function material together with the high-bandgap barrier material to minimize the effect of direct tunneling and Fowler-Nordheim (F-N) tunneling through the barrier. Thus, these barrier layers together with the high-work-function metals (electrodes) may redirect the current to flow through the device such that the defects in the semiconductor layer can be identified by the defect spectroscopy process.

The process may include receiving a number of different measurements 820, including current-voltage measurements 820-1, conductance-voltage measurements 820-2, capacitance-voltage measurements 820-3, and/or other measurements of the electrical characteristics of the combined stack 823. These measurements 820 may be provided as inputs to a defect spectroscopy system 822. Any commercially available defect spectroscopy tool may be used as the defect spectroscopy system 822. For example, the defect spectroscopy system may be configured to cause current to flow through the semiconductor layer. As described above, the barrier layer together with the precise workfunction tuning may prevent the current from flowing via the conduction band and instead cause the current to flow through defects in the semiconductor layer.

In some embodiments, the combined stack may use specific materials for the electrodes to energetically place the work function of the electrodes in a location that likely results in conduction through the defects. For example, some embodiments may use a material for the electrodes that is at least approximately 0.4 eV greater than the affinity of the semiconductor layer (i.e., the distance between the bandgap of the semiconductor layer and the vacuum level). At the same time, the work function of the electrodes may also be smaller than the affinity of the semiconductor layer plus the bandgap of the semiconductor layer (e.g., the affinity of the semiconductor layer plus approximately one half of the bandgap of the semiconductor layer). This will tend to place the work function of the electrode energetically close to the middle of the energy band of the semiconductor layer. The specific materials used for the electrodes may be selected based on the materials used for the semiconductor layer. For example, once a material for the semiconductor layer is chosen, a material having a work function that falls within the range specified above can be selected from known material properties in the art.

Additionally, the discrete layer characterizations 824 from the stacks described above may also be received as inputs. This may include the characterizations from the first stack 300 and the second stack 400 that characterize the semiconductor layer and the barrier layer individually. The output of the defect spectroscopy system 822 may include a data set. An example output data set is illustrated in FIG. 8 in graph 800.

Note that this same setup may be used to characterize the semiconductor layer and/or the barrier layer in the first stack 300 and/or the second stack 400 described above. For example, the defect spectroscopy system 822 may be used to measure the baseline characteristics of the barrier stack in the second stack 400 and/or the semiconductor stack in the first stack 300.

Because the defects 802 in the barrier layers have already been identified and located, these can be eliminated as a variable from the defects detected by the defect spectroscopy process on the combined stack. Therefore, any new defects that are found will be defects 804 located in the semiconductor layer itself. Using the parameters measured in the defect spectroscopy characterization process of the stacks comprising the barrier alone and the semiconductor layer alone eliminates variables and unknowns from the defect spectroscopy process on the combined stack. This allows the combined stack to accurately identify the defects 804 that are located in the semiconductor layer.

In some embodiments, different metals or silicon (with high p-type) doping may be used to fabricate the first and second electrodes. P-type doping shifts the Fermi level of the silicon-based electrode further from the conduction band by an amount equivalent to the increase of the work function of the metal, and in turn minimizes the impact of direct and F-N tunneling into the conduction band of the semiconductor under test. For example, the particular material chosen for the barrier layers may have a higher dielectric constant, which may cause the energy bands to bend more than other materials. This may shift the conduction path away from the defects 804 in the semiconductor layer. Therefore, a work function differential between the two electrodes may be used to drive current directly through the defects 804 such that they can be adequately identified by the defect spectroscopy process. For example, the second electrode 806 may have a lower work function than the first electrode 808, thereby lowering the energy level of the second electrode 806 to compensate for any band-bending that may take place.

As described above for the barrier layers, the defects 804 in the semiconductor layer may be characterized by the location of the median of the distribution of defects relative to the conduction band of the semiconductor layer. Some embodiments may also characterize a standard deviation or spread of the defects relative to the median location. The distance of the defects 804 from the conduction band of the semiconductor layer can be compared to known tables and information readily available in the art to characterize those defects using the same process described above in relation to FIG. 7. Therefore, the defect spectroscopy may reveal the location of the defects relative to the conduction band, and this may be compared to existing tables to identify and characterize the type of defect present in the semiconductor layer.

Figure 9:
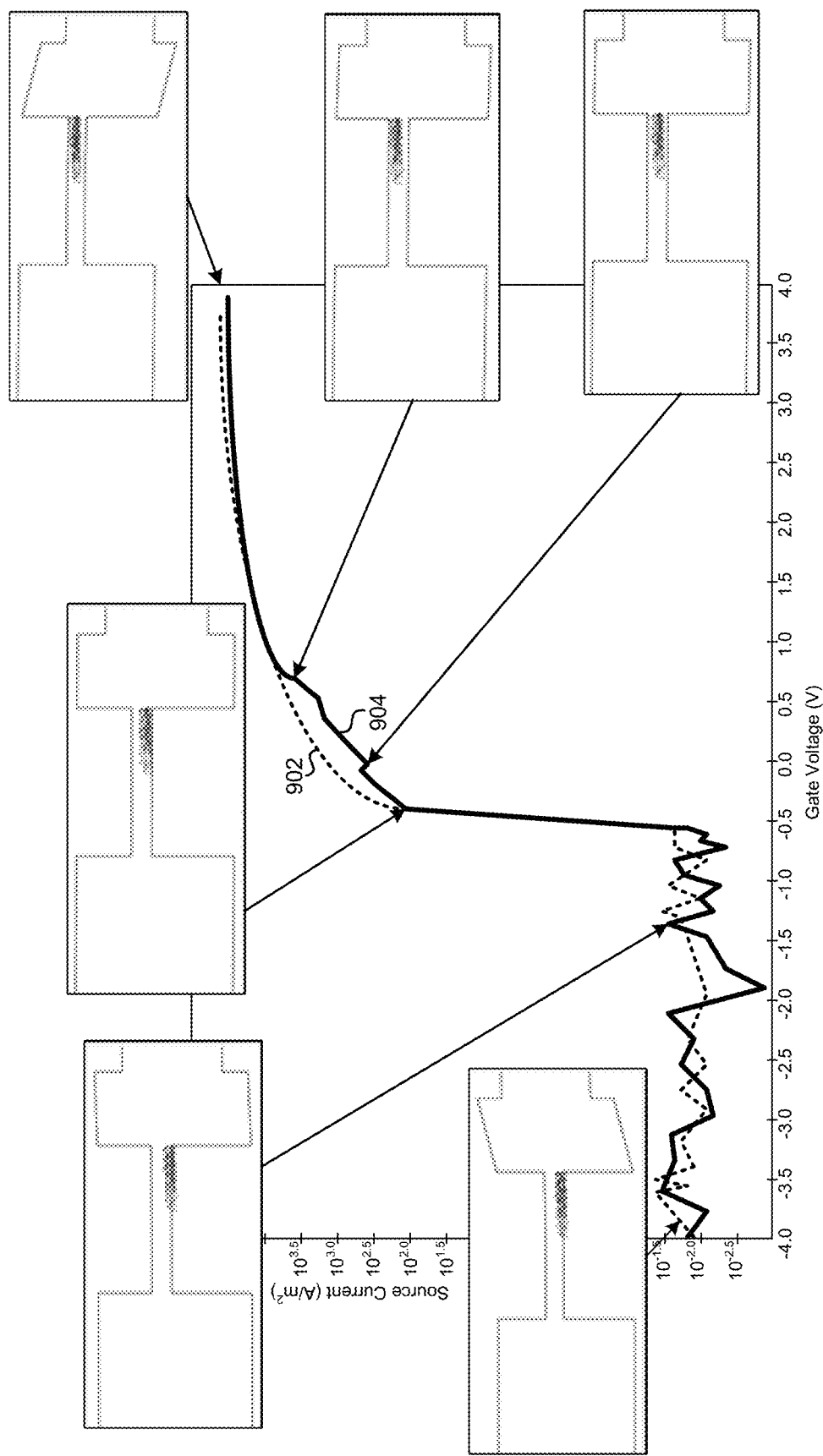
FIG. 9 illustrates a simulation of transistor Id-VG characteristics and the resulting impact of the defects within the semiconductor layer that are extracted using the characteristics of the semiconductor layer, according to some embodiments.

FIG. 9 illustrates a simulation using the characteristics of the semiconductor layer, according to some embodiments. Once the location of the defects in the semiconductor layer are identified, and the type of defect may be ascertained as described above, these defects may then be used to model and simulate device properties using the targeted semiconductor material. For example, a particular composition of indium, gallium, and/or zirconium oxides may be deposited for use as a channel material of a transistor. This particular stoichiometry of IGZO may be characterized using the process described above to identify the location and types of defects in this semiconductor oxide used to implement the semiconductor layer described above. FIG. 9 illustrates a simulation that may then be carried out using a model of the transistor with a channel formed by the previously characterized IGZO channel material.

The model using the actual defects types and locations from the characterization process described above may be much more accurate than other simulations. For example, a simulation that does not use the specific types and locations of defects in the semiconductor layer may produce an ideal curve 902. However, when adding the types and locations of defects to the simulated model for the IGZO material, the simulated curve 904 includes a dip in the current that would otherwise be missed by the simulation. This dip in the current may also be observed by measuring a physical device using the composition of IGZO to match the simulation. Therefore, the simulation using the defect-characterized semiconductor layer more accurately models the physical characteristics of the material.

Many different compositions of IGZO may be used in various devices. The process described above may be used to characterize many different compositions of IGZO and other semiconductor oxides used in semiconductor layers. For example, a single stack comprising the barrier layer (such as the second stack 400 described above) may be characterized. Then, a plurality of different compositions of semiconductor oxides may be characterized as described above (such as the first stack 300). The combined stacks featuring the barrier layers and the semiconductor layers may then be characterized to identify the locations and types of defects in each composition of the IGZO. Results may be used to populate a library of different IGZO compositions used in semiconductor devices, such as transistors.

Figure 10:
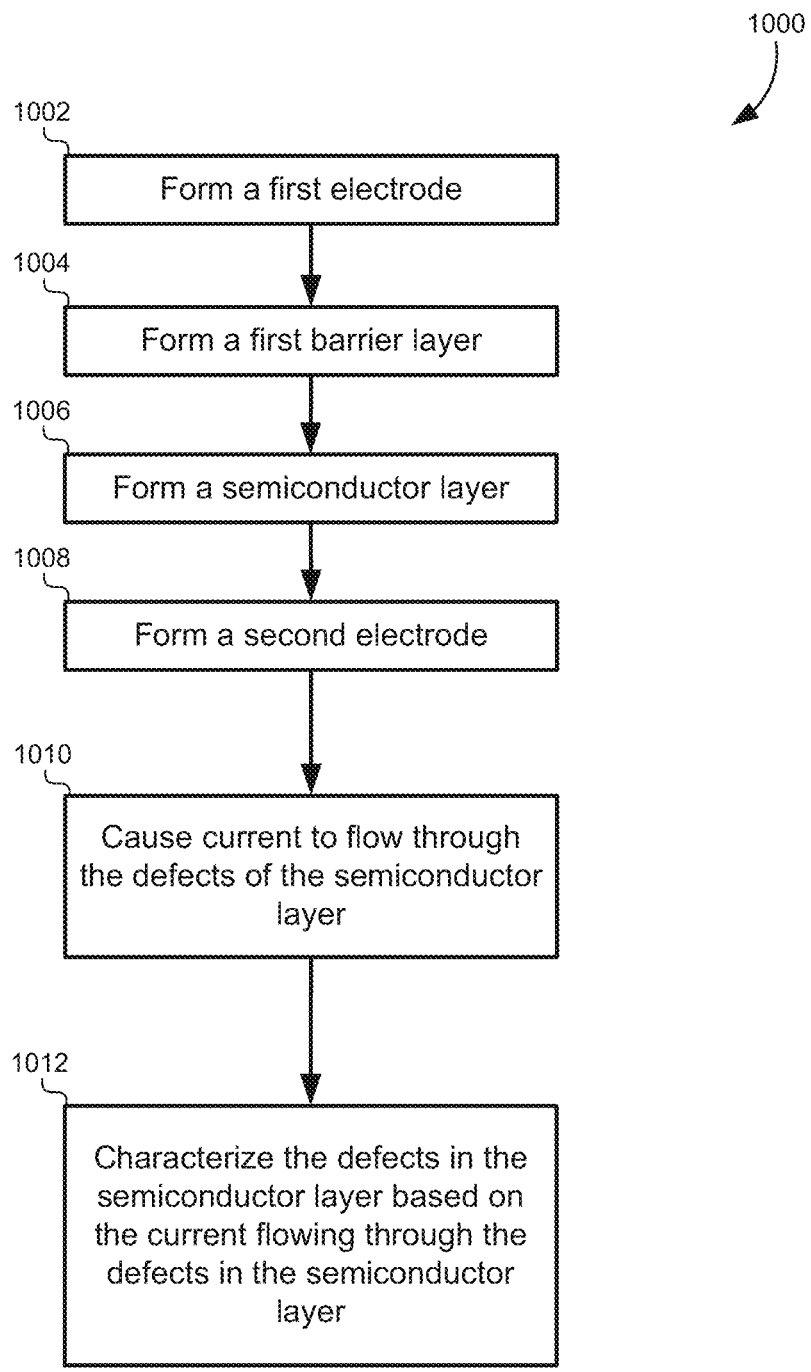
FIG. 10 illustrates a flowchart 1000 of a method for characterizing defects in a semiconductor layer, according to some embodiments.

FIG. 10 illustrates a flowchart 1000 of a method for characterizing defects in a semiconductor layer, according to some embodiments. The method may include forming a first electrode (1002) and forming a first barrier layer (1004) as described above. The method may further include forming a semiconductor layer such that the first barrier layer is between the first electrode and the semiconductor layer (1006). The method may additionally include forming a second electrode such that the semiconductor layer is between the first barrier layer and the second electrode (1008). These steps may be performed by semiconductor manufacturing equipment, such as deposition chambers, etch chambers, polishing chambers, cleaning chambers, and so forth. These various layers may be combined to form a semiconductor and barrier stack, such as the third stack described above in relation to FIG. 5.

The method may also include steps that are performed by a defect spectroscopy system. However, these steps may also be performed by other test systems and equipment and the particular system type is not meant to be limiting. The method may further include causing current to flow through the semiconductor layer (1010). The first barrier layer may prevent the current from entering a conduction band of the semiconductor layer, and instead may cause the current to flow through the defects in the semiconductor layer as described in detail above. The method may then include characterizing the defects in the semiconductor layer based on the current flowing through the defects in the semiconductor layer (1012). Characterizing these defects may include identifying locations of distributions or mean values relative to a conduction band, and identifying defect types based on their locations relative to the conduction band.

The method of flowchart 1000 may be executed after a semiconductor stack (e.g., FIG. 3) and/or a barrier stack (e.g., FIG. 4) has been benchmarked, and the results may be used to characterize the defects in the semiconductor layer. The type of and location of the defects may then be used for that semiconductor material in simulations of circuit elements by simulation software or a simulation system.

It should be appreciated that the specific steps illustrated in FIG. 10 provide particular methods of characterizing defects in a semiconductor layer according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Many variations, modifications, and alternatives also fall within the scope of this disclosure.

Throughout this disclosure, the term "approximately" may be used to describe values that occur within a range of −15% to +15% of the stated value. For example, a capacitance of approximately 100 nm may fall within the range of 85 nm to 115 nm.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A method of characterizing defects in semiconductor layers, the method comprising:
   forming a first electrode;
   forming a first barrier layer;
   forming a semiconductor layer, wherein the first barrier layer is between the first electrode and the semiconductor layer;
   forming a second electrode, wherein the semiconductor layer is between the first barrier layer and the second electrode;
   causing current to flow through the semiconductor layer, wherein the first barrier layer prevents the current from entering a conduction band of the semiconductor layer and instead causes current to flow through defects in the semiconductor layer; and
   characterizing the defects in the semiconductor layer based on the current flowing through the defects in the semiconductor layer.

2. The method of claim 1, further comprising forming a second barrier layer between the semiconductor layer and the second electrode.

3. The method of claim 1, wherein the first barrier layer prevents a metal-semiconductor interface from forming between the first electrode and the semiconductor layer.

4. The method of claim 1, further comprising:
   forming a barrier stack comprising a top electrode, a barrier layer, and a bottom electrode, wherein the barrier layer comprises a same material as the first barrier layer;
   characterizing the defects in the barrier layer; and
   providing locations and types of the defects in the barrier layer as an input to a process for characterizing the defects in the semiconductor layer.

5. The method of claim 4, further comprising:
   forming a semiconductor stack comprising a second top electrode, a second semiconductor layer, and a second bottom electrode, wherein the second semiconductor layer comprises a same material as the semiconductor layer;
   characterizing the second semiconductor layer to identify a doping level or a metal-semiconductor junction characteristic; and
   providing the doping level or the metal-semiconductor junction characteristic input to the process for characterizing the defects in the semiconductor layer.

6. The method of claim 1, wherein characterizing the defects in the semiconductor layer comprises:
   identifying a distribution of defects in the semiconductor layer;
   identifying a mean of the distribution of the defects in the semiconductor layer; and
   identifying a location of the mean of the distribution relative to a conduction band of the semiconductor layer.

7. The method of claim 6, wherein characterizing the defects in the semiconductor layer further comprises:
   using the location of the mean to identify a type of the defects in the semiconductor layer by comparison to a predetermined distribution of defects types in a material used in the semiconductor layer.

8. The method of claim 1, further comprising simulating a model of a circuit, wherein the model comprises:
   a layer of a material used in the semiconductor layer; and
   types and locations of defects in the material.

9. The method of claim 1, wherein a work function of the first electrode is approximately at a center of an energy band of the semiconductor layer.

10. The method of claim 1, wherein the first electrode has a work function that is higher than a work function of the second electrode, and a work function difference between the first electrode and the second electrode induces an electric field across the semiconductor layer and the first barrier layer.

11. The method of claim 1, wherein the semiconductor layer comprises a composition of indium, gallium, and zinc oxides.

12. The method of claim 1, wherein the first barrier layer has a bandgap energy that is at least 1.5 times greater than a bandgap energy of the semiconductor layer.

* * * * *